United States Patent
Manaker, Jr.

(10) Patent No.: US 7,472,365 B1
(45) Date of Patent: Dec. 30, 2008

(54) METHOD FOR COMPUTING HOLD AND SETUP SLACK WITHOUT PESSIMISM

(75) Inventor: Walter A. Manaker, Jr., Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 652 days.

(21) Appl. No.: 10/997,621

(22) Filed: Nov. 24, 2004

(51) Int. Cl.
*G06F 17/50* (2006.01)
(52) U.S. Cl. .................... 716/6; 716/1; 716/2; 716/12
(58) Field of Classification Search ............... 716/1, 716/2, 6, 12
See application file for complete search history.

(56) References Cited

U.S. PATENT DOCUMENTS

| | | | |
|---|---|---|---|
| 4,410,940 | A | 10/1983 | Carlson et al. |
| 5,452,239 | A | 9/1995 | Dai et al. |
| 5,608,645 | A * | 3/1997 | Spyrou ............... 716/6 |
| 5,790,435 | A | 8/1998 | Lewis et al. |
| 5,852,640 | A | 12/1998 | Kliza et al. |
| 6,046,984 | A | 4/2000 | Grodstein et al. |
| 6,470,482 | B1 | 10/2002 | Rostoker et al. |
| 6,539,535 | B2 | 3/2003 | Butts et al. |
| 7,076,401 | B2 | 7/2006 | Mellitz |
| 7,109,750 | B2 | 9/2006 | Vadi et al. |

OTHER PUBLICATIONS

Xilinx, Inc.; "Virtex-II Platform FPGA Handbook"; published Dec. 2000; available from Xilinx, Inc., 2100 Logic Drive, San Jose, California 95124; pp. 33-75.
U.S. Appl. No. 10/997,565, filed Nov. 24, 2004, Manaker, Walter A. "An Efficient Method for Computing Clock Skew Without Pessimism", Xilinx, Inc. 2100 Logic Drive, San Jose, CA 95124.
Zeljda, J. et al., "General Framework for Removal of Clock Network Pessimism", Synopsys, Computer Aided Design, 2002 ICCAD 2002 IEEE/ACM International Conference, Nov. 10-14, 2002 pp. 632-639,Digital Object Identifier 10.1109/ICCAD.2002.1167599.

* cited by examiner

*Primary Examiner*—Thuan Do
(74) *Attorney, Agent, or Firm*—Timothy W. Markison; Justin Liu

(57) ABSTRACT

The present invention includes a method and an apparatus, in one embodiment, in the form of an integrated circuit and programmable fabric design tool, for calculating skew in a manner that does not include unnecessary skew values, resulting in a skew value without pessimism. A setup slack determination ensures that data launched or transmitted from a source register reaches the destination register within a specified maximum cycle time and is defined as the difference between a minimum (early) destination time and a maximum (late) source time without unnecessary skew values. A hold check slack determination ensures the data does not "race" from the source register to the destination register on the same clock edge and is calculated as a difference between a maximum (late) destination time and a minimum (early) source time without unnecessary skew values. A circuit's operational frequency and layout are based upon the method for calculating skew.

7 Claims, 15 Drawing Sheets setup skew determination

Figure 3  circuit 70 with programmable fabric with logic elements arranged for minimal clock skew for clock paths Figure 4A circuit elements with delay Figure 4B circuit elements with delay Figure 5 programmable logic with delay elements Figure 6 setup skew determination Figure 7 hold check value determination Figure 8 frequency of operation determination Figure 9  design tool 210 with logic for skew calculation frequency of operation determination

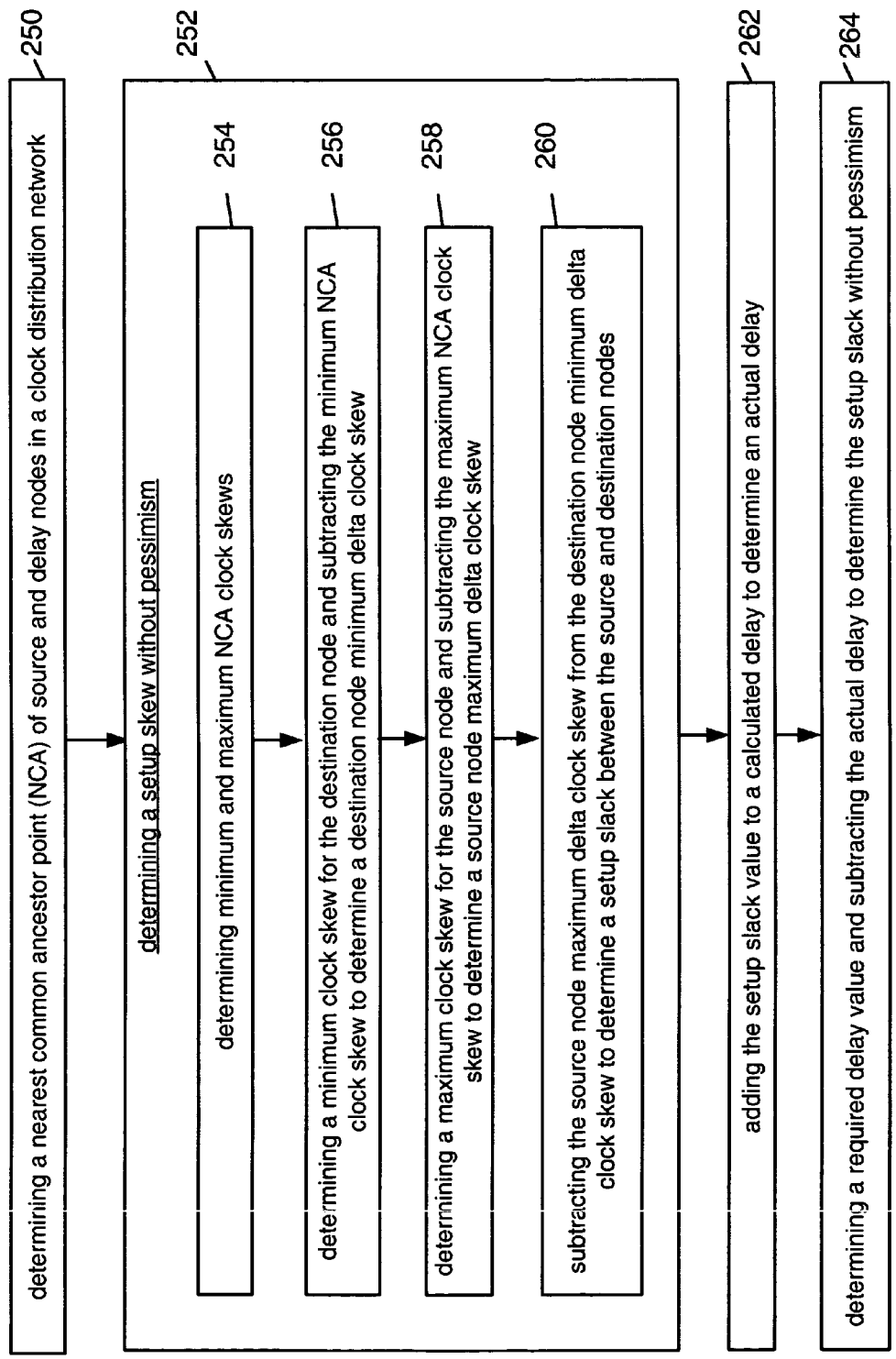
Figure 11 setup slack determination

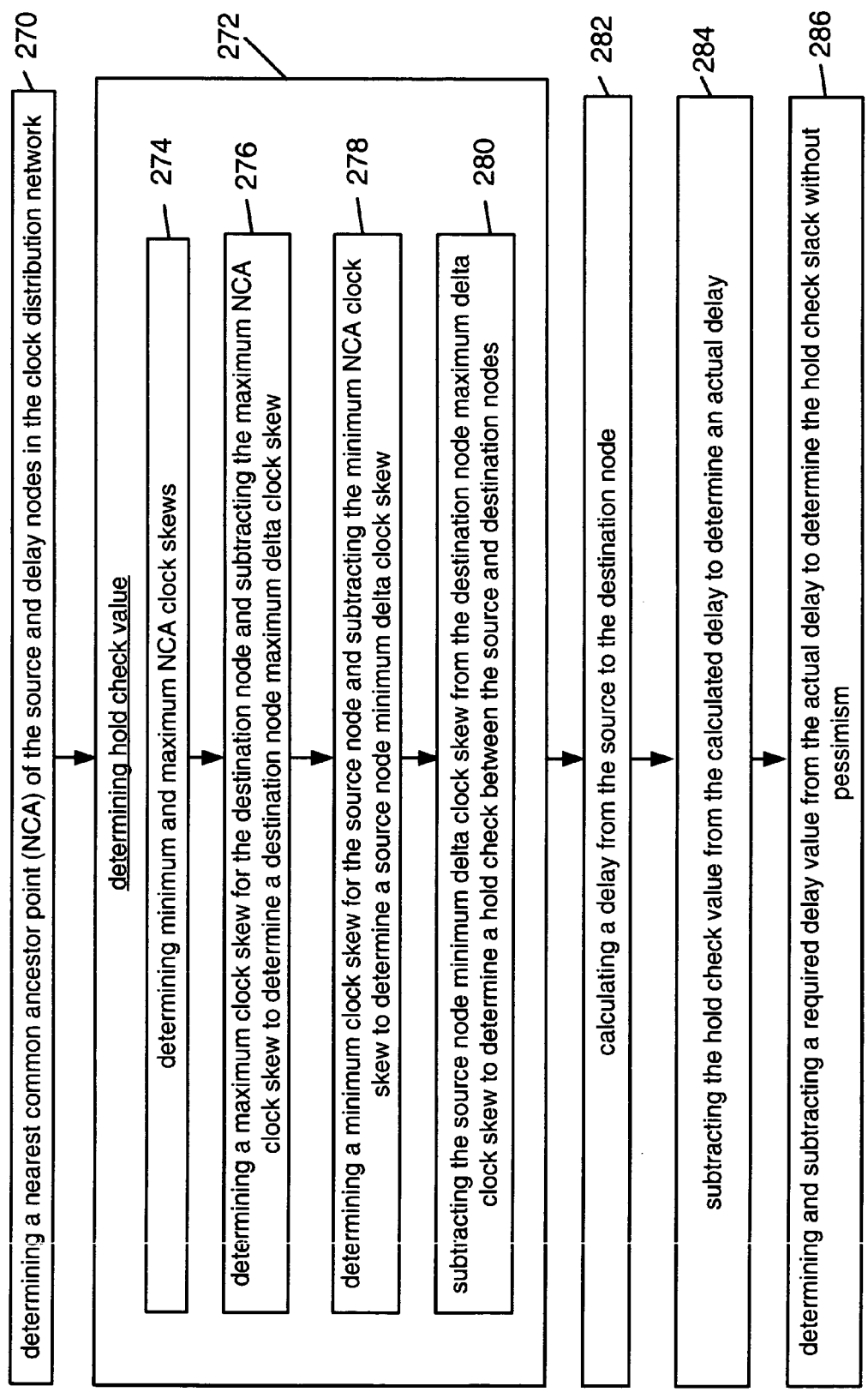
Figure 12 hold check slack determination

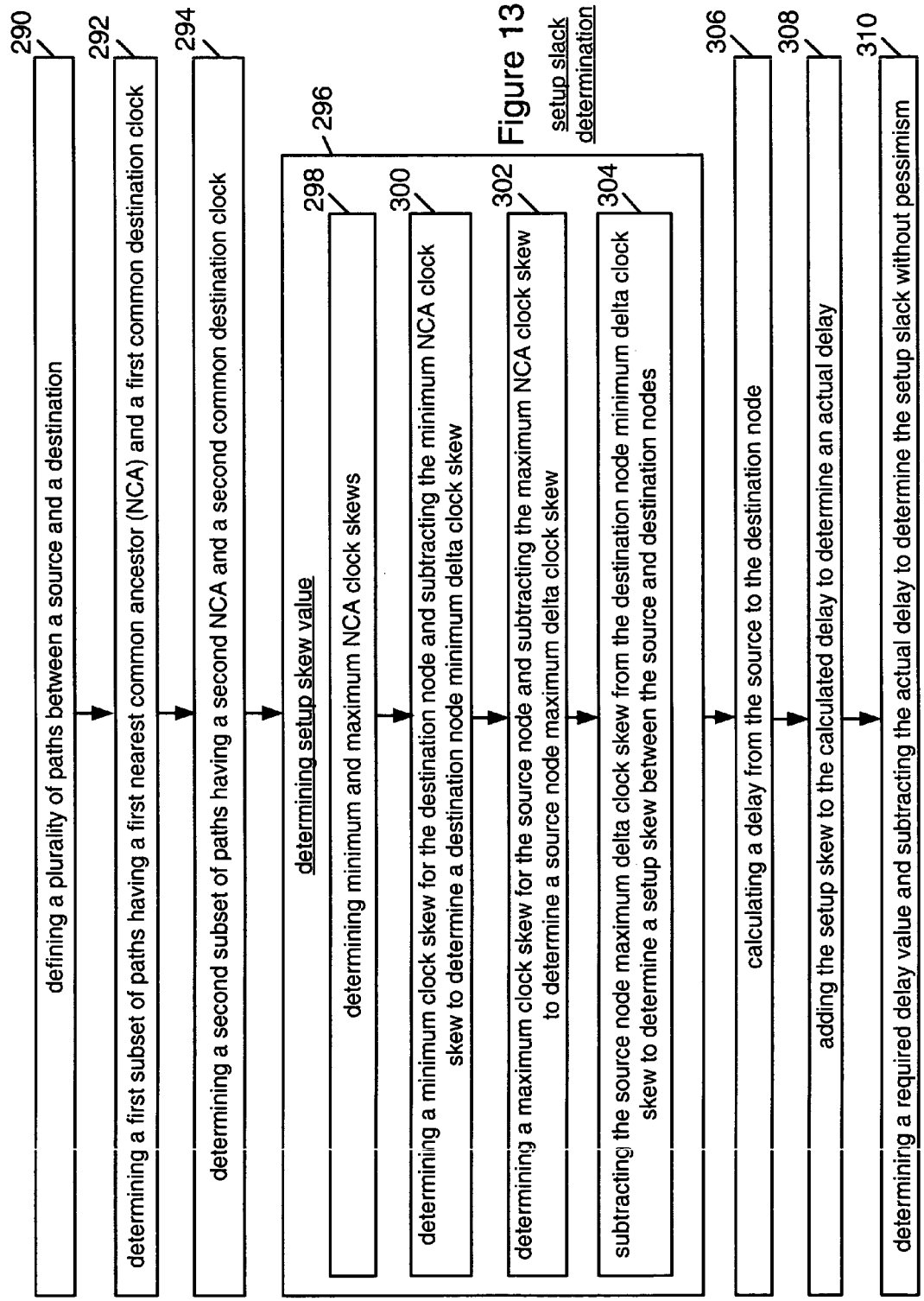

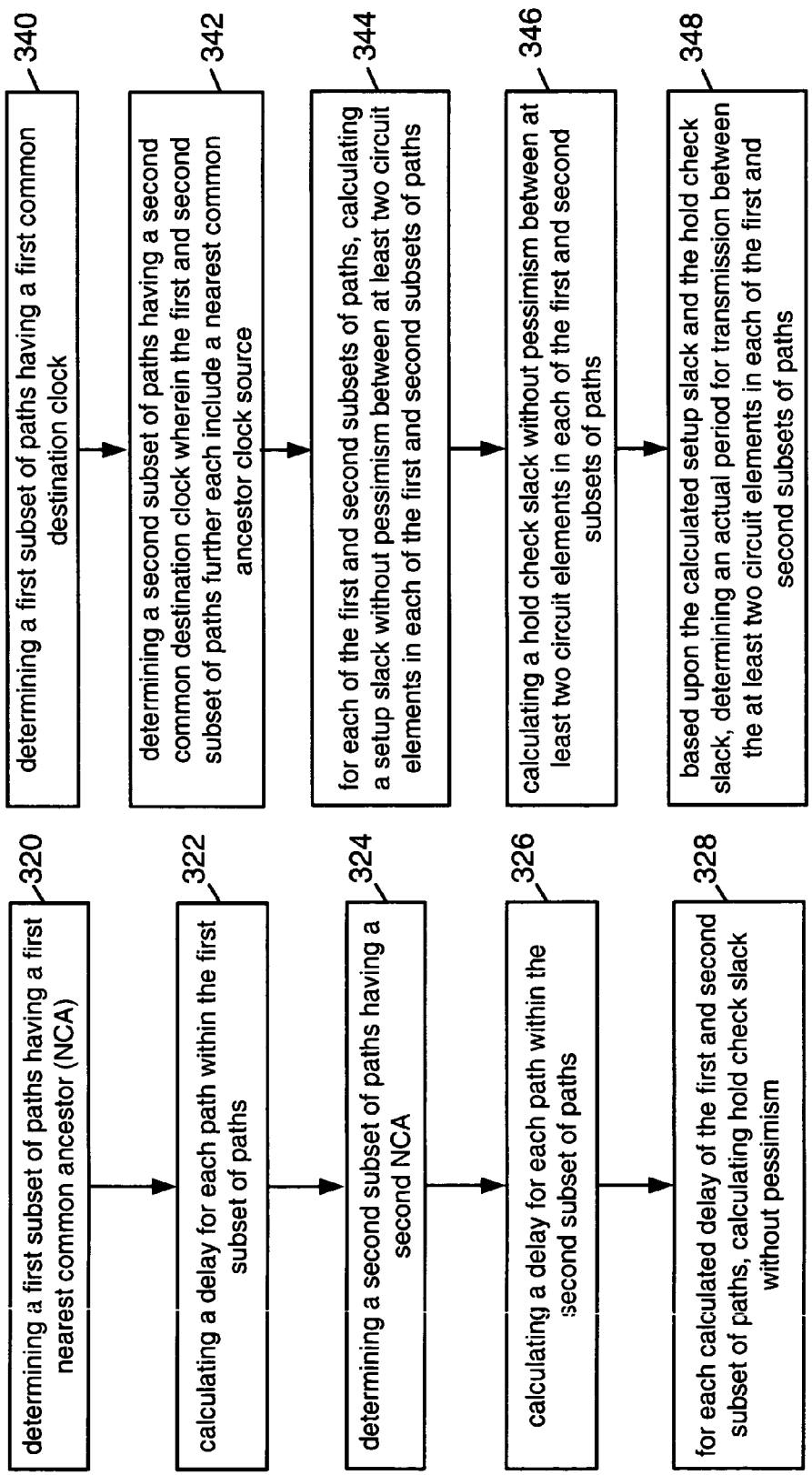

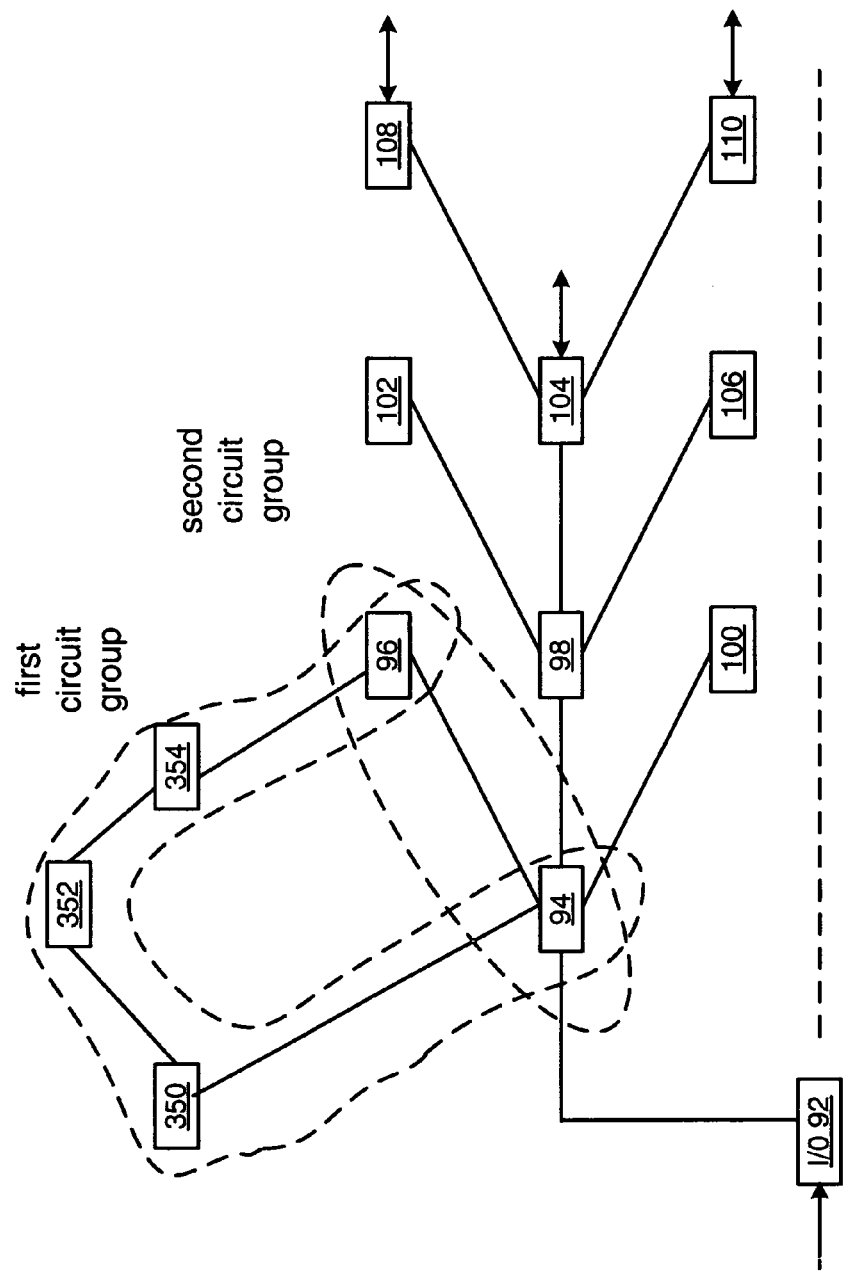
Figure 16 circuit elements with delay

METHOD FOR COMPUTING HOLD AND SETUP SLACK WITHOUT PESSIMISM

BACKGROUND OF THE INVENTION

This invention relates generally to communication systems and more particularly to high data rate circuits and static timing analysis thereof.

DESCRIPTION OF RELATED ART

Communication systems are known to transport large amounts of data between a plurality of end user devices, which, for example, include telephones (i.e., land lines and cellular), facsimile machines, computers, television sets, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or the Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits-per-second, 1 gigabit-per-second and beyond. Synchronous Optical NETwork (SONET), for example, currently provides for up to 10 gigabits-per-second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss of information.

Accurate recovery of information from high-speed serial transmissions typically requires transceiver components that operate at clock speeds equal to or higher than the received serial data rate. Higher clock speeds require oscillator circuits to have gain-bandwidth products to sustain high frequency oscillations while maintaining low phase noise. High phase noise contributes to clock jitter which degrades clock recovery in high-speed circuits. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits. Integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance or phase noise performance.

Modern communication systems typically include a plurality of circuit boards that communicate with each other by way of signal traces, bundled data lines, back planes, etc. Accordingly, designers of communication transceiver devices often have conflicting and mutually exclusive design goals that relate to the performance of the particular device. Thus, a designer either cannot satisfy these mutually exclusive requirements (and therefore cannot support multiple protocols) or must design a transceiver device that can adapt according to the protocol being used for the communications.

Along these lines, programmable logic devices (PLDs), including field programmable gate arrays (FPGAs) circuits are gaining in popularity for providing the required flexibility and adaptable performance, as described above, for those designers that seek to build one device that can operate according to multiple configurations. Thus, while FPGA technology affords a designer an opportunity to develop flexible and configurable hardware circuits, specific designs that achieve the desired operations must still be developed.

Clock skew is the clock inaccuracy introduced by the clock distribution system of a device such as the aforementioned FPGAs and other integrated circuit devices. Clock skew does not include any inaccuracy in the clock generation circuitry in contrast to the above-described jitter. Clock skew is often measured on register-to-register paths of a circuit to ensure that the desired minimum and maximum cycle time constraints for a circuit are satisfied.

Measuring clock skew for register-to-register paths of related, but topologically separate, clock circuits requires calculating clock skew using the full clock path delays of the source and destination registers. Thus, common prior art designs include circuitry that is arranged and is operated according to determined skew values for a full clock path. However, using the full clock path delay to calculate skew when the source and destination clocks have common circuit topology is pessimistic. Stated differently, clock skew calculations tend to be unreasonably high when source and destination circuit elements have common circuit paths.

Static timing analysis of circuit designs including FPGA designs is used to ensure that no errors exist relative to any specific timing constraints on the design. An important aspect of static timing analysis is accounting for the effects of clock skew on circuit functions. Exact clock skew can be calculated using the clock path delays of the source and destination registers of a register-to-register path. However, these calculations can lead to overly pessimistic clock skew valuations when the source and destination clock paths have common circuitry.

Accordingly, there is a need for accurately determining the actual clock skew and for programmable logic that is arranged according to the accurately determined actual clock skew.

BRIEF SUMMARY OF THE INVENTION

The embodiments of the present invention includes a method for calculating skew in a way that is conservative for calculating both minimum and maximum arrival times but is not pessimistic. Along these lines, the method generally includes subtracting a clock skew for a nearest common ancestor for two circuit elements for which clock skew is being calculated for a single-source clock. For example, past methods have included evaluating the total clock skew for each of the two circuit elements and summing their calculated clock skew values. In the present invention, however, only clock skew values from a nearest common ancestor are added to determine the clock skew (for both types of skew calculations) between two circuit elements.

A setup slack calculation ensures that data launched (transmitted) from a source register reaches the destination register in a specified maximum cycle time. A calculated delay is summed with a setup skew, which sum is subtracted from a required delay value to determine setup slack. A setup skew is defined herein as being the difference between a minimum (early) destination time and a maximum (late) source time. A hold check slack calculation ensures the data does not "race" from the source register to the destination register on the same clock edge and is a sum of transmission delay and a hold check. The hold check value is subtracted from a calculated delay to produce an actual delay. A required delay is subtracted from the actual delay to determine the hold check slack.

As stated above, a setup skew calculation is defined as being a difference between a minimum early destination time and a maximum late source time. Similarly, a hold check slack is defined as being a difference between a maximum destination time and minimum source time. In calculating the destination and source times, however, skew times for a nearest common ancestor are subtracted to avoid the inclusion of unnecessary amounts of skew in skew and slack calculations. Accordingly, calculated skew and slack values and corresponding transmission timing calculations are not pessimistic and are smaller in magnitude in contrast to calculations performed by traditional methods.

Having skew and slack calculations for transmissions from a source to a destination circuit element or register has many benefits. First, more accurate frequencies of operation may be determined. Alternatively, for a specified frequency, circuit layouts may be modified thereby giving the designer or, as described herein, a circuit design/layout tool, more options for placement of circuit components.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

FIG. 11 is a flowchart illustrating a method for calculating setup slack without pessimism for a delay between a source node and a destination node according to one embodiment of the present invention;

FIG. 12 is a method for calculating hold check slack without pessimism for a transmission between a source node and a destination node according to one embodiment of the invention;

FIG. 13 is a flowchart that illustrates a method for calculating an actual delay for setup slack in programmable fabric according to one embodiment of the invention;

FIG. 14 is a flowchart illustrating a method for calculating a hold check slack for a plurality of nodes defining a plurality of paths within a programmable fabric according to one embodiment of the invention;

FIG. 15 is a flowchart illustrating a method for calculating a transmission period in programmable fabric according to one embodiment of the present invention; and FIG. 16 is a functional schematic block diagram illustrating one aspect of the present invention.

DETAILED DESCRIPTION OF THE INVENTION

Figure 1:
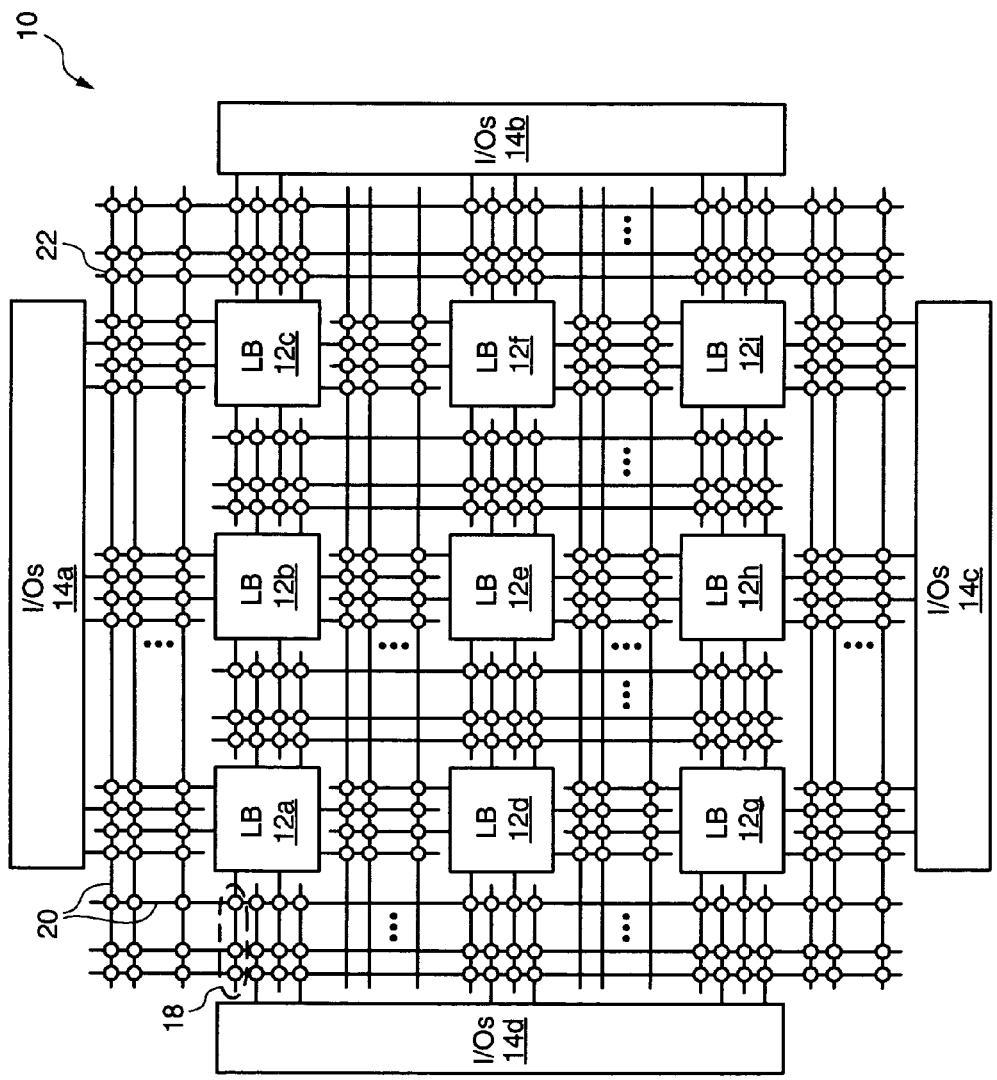
FIG. 1 is a schematic block diagram of a programmable logic device.

FIG. 1 is a simplified illustration of a programmable logic device, which may be an FPGA 10. FPGA 10 of FIG. 1 includes an array of configurable logic blocks (LBs 12a-12i) and programmable input/output blocks (I/Os 14a-14d). The LBs and I/O blocks are interconnected by a programmable interconnect structure that includes a large number of interconnect lines 20 interconnected by programmable interconnect points (PIPs 22, shown as small circles in FIG. 1). PIPs are often coupled into groups (e.g., group 18) that implement multiplexer circuits selecting one of several interconnect lines to provide a signal to a destination interconnect line or logic block. Some FPGAs also include additional logic blocks with special purposes (not shown), such as DLLs, RAM, processors, multipliers, and transceivers. Note that FPGA 10 shown in FIG. 1 is merely one example of a programmable logic device, and other arrangements are possible and known in the art.

Figure 2:
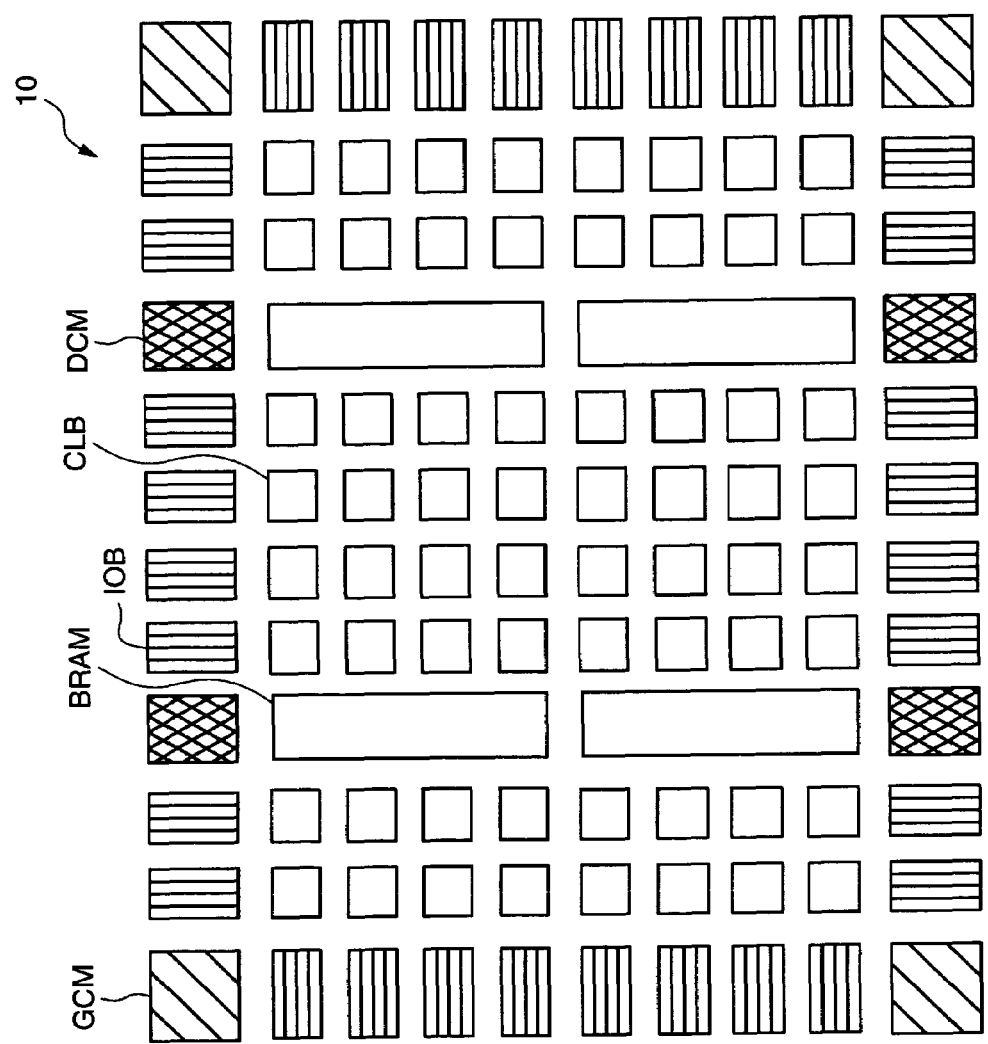
FIG. 2 is a floor plan diagram of a programmable logic device.

Advanced FPGAs may include several different types of programmable logic blocks in the array. For example, FIG. 2 illustrates a Xilinx Virtex®-II FPGA that includes blocks of Random Access Memory (RAM) and blocks implementing multiplier functions. (The Xilinx Virtex-II FPGA is described in detail in pages 33-75 of the "Virtex-II Platform FPGA Handbook", published December, 2000, available from Xilinx, Inc., 2100 Logic Drive, San Jose, Calif. 95124, which pages are incorporated herein by reference.)

The Virtex-II FPGA includes, in addition to CLBs and IOBs, blocks of random access memory (BRAM), global clock manager circuits (GCM), and digital clock manager circuits (DCMs). Note that the block RAM circuits may differ from the configuration memory cells in that the block RAM is used to store user data, while the configuration memory cells (not shown in FIG. 2) are used to control the functionality of the user design loaded into the FPGA. As noted above, other programmable devices may include other types of blocks in various arrangements.

Figure 3:
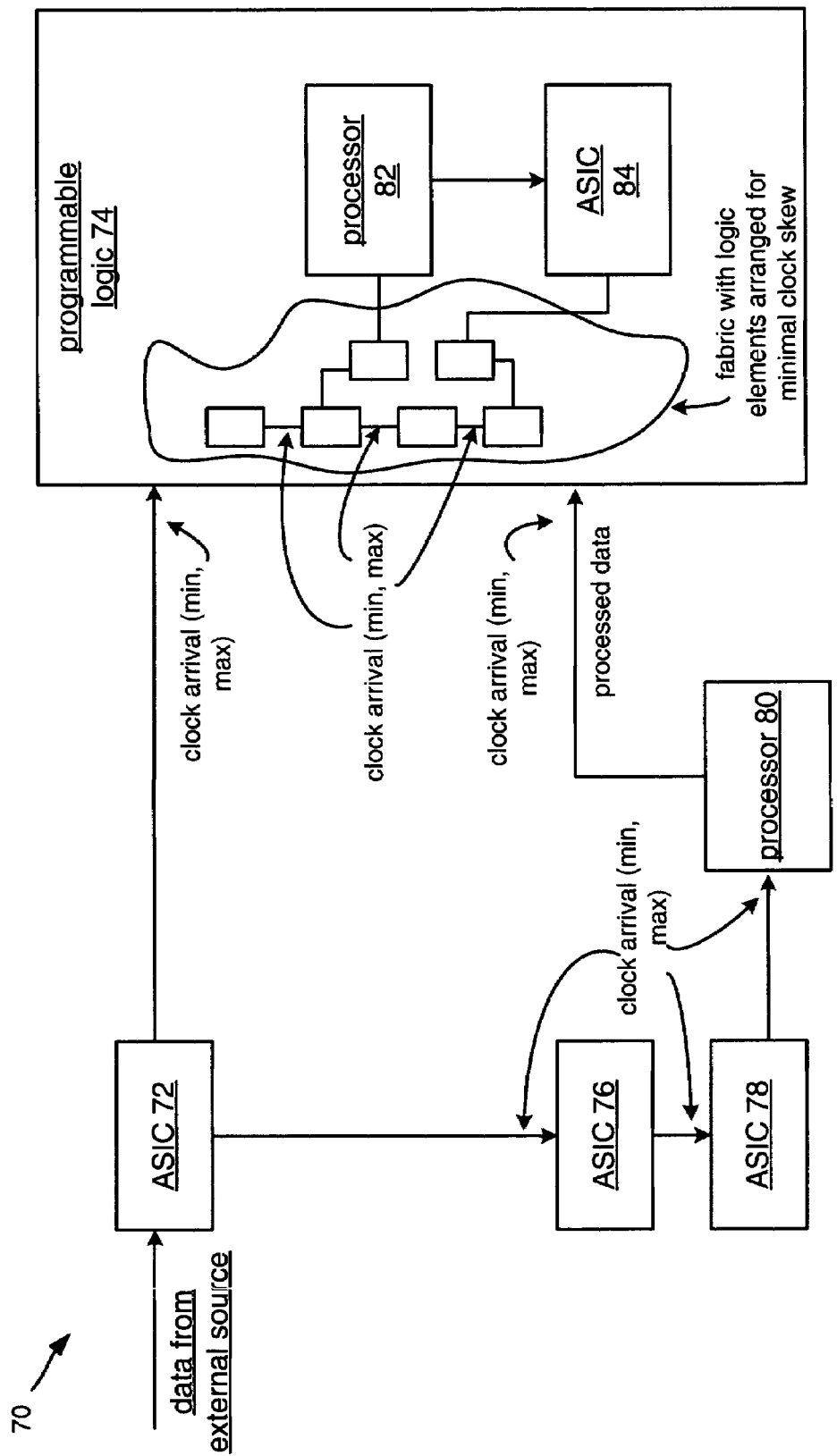
FIG. 3 is a functional block diagram of a circuit with programmable fabric with circuit and logic elements that illustrates minimal clock skew determination according to one aspect of the present invention.

FIG. 3 is a functional block diagram of a circuit with programmable fabric with circuit and logic elements that illustrates clock skew determination according to one aspect of the present invention. More specifically, FIG. 3 includes a circuit 70 that may include devices or circuits such as ASIC devices, processors, programmable logic and other circuit elements. Moreover, the programmable logic, in the described embodiment, further includes programmable logic interconnect points, logic elements, driver, buffer, transistors and other circuit level devices that include delay causing circuitry. Between any two registered elements in FIG. 3, there exists a data path and a clock path (logically if not electrically) wherein the clock path experiences a delay from element to element. For example, in an FPGA, buffered programmable interconnect points are specifically included because they produce a delay (thus defining an outgoing sibling clock that is different from the ingoing clock for the received data). Moreover, especially at high frequencies, resistance and capacitive impedance of the traces and lines within the circuit add further delay for a propagated signal. Accordingly, each circuit element, whether it be an ASIC or a mere trace that adds delay (and creates a sibling clock) may be analyzed for consideration as a nearest common ancestor for two or more circuit elements or registers (e.g., descendant nodes) that are transmitting signals therebetween when calculating skew (for setup slack and hold check slack) without pessimism.

Referring more specifically to FIG. 3, a circuit 70 includes an ASIC 72 that is coupled to receive data from an external source, which data is received according to a received clock. ASIC 72 then provides data to programmable logic 74 and to ASIC 76. ASIC 76 then processes the data and provides data to ASIC 78. Thereafter, ASIC 78 provides the processed data from ASIC 76 to processor 80, which in turn, processes the received data and provides the processed data to programmable logic 74.

As may be seen, programmable logic 74 receives processed data from both ASIC 72 and processor 80. Each of the circuit elements within circuit 70 that receives and processes data also introduces an amount of delay and therefore produces processed data having a different (sibling) clock than the received data. While the data is received directly from ASIC 72 on one input, other processed data from ASIC 72 is received after being processed by a plurality of different circuit elements. More specifically, data is also received by programmable logic 74 after being processed by ASIC 76, ASIC 78, and processor 80. As each of the circuit elements, namely, ASIC 76, ASIC 78, and processor 80, processes the data, an additional amount of delay or clock skew is added at each circuit element. Additionally, the processed data received by programmable logic 74 further encounters additional delays as processed by individual logic elements, each introducing some delay, as well as by a processor 82 and ASIC 84.

Generally, as data is produced from any given logic or circuit element (including traces, resistors and transistor level devices), ASIC, or processor, the data is produced with a clock that is different from the clock for the received data. By definition, the outgoing clock from a circuit delay is different that an ingoing clock if the circuit element introduces any delay. Moreover, because the amount of delay can vary, the timing for a transmission can vary as a signal propagates through a circuit. Thus, a circuit designer must account for minimum and maximum circuit element delays. Typically, circuit designers account for clock skew for every circuit element or logic device between an input port and a specified device. Along these lines, circuit designers consider a minimum and a maximum arrival time of a signal at each circuit element. Thus, circuit logic is driven by timing considerations that relate to the circuit topology. In a device having large numbers of components and, therefore, large numbers of sibling clocks in a clock distribution network, unnecessarily large values of skew may drastically limit design and operation options.

Moreover, operational frequencies are selected based upon calculated skew and hold check values. Thus, pessimistic skew and hold check calculations may result in a selected frequency of operation being lower than possible or desirable. Because a pessimistic calculation is one that includes unnecessary skew or hold check values, reducing or removing pessimism facilitates higher frequencies of operation being selected or, alternatively, arrangement of components may be modified based upon accurate calculations.

The current methods for performing static timing analysis include calculating minimum and maximum delays for common or shared circuit elements resulting in a calculated skew value that is unnecessarily large. As will be described in greater detail below, removing common circuit elements from static skew calculations results in accurate skew timing calculations that give the circuit designer different and perhaps better options for circuit topology or operation in a given design. The present invention is advantageous in that the nearest common ancestor may be defined for any circuit element including a circuit trace. By providing a method for calculating the clock skew with this level of granularity, a mere circuit path may be used to eliminate unnecessary or pessimistic skew values.

Figure 4:
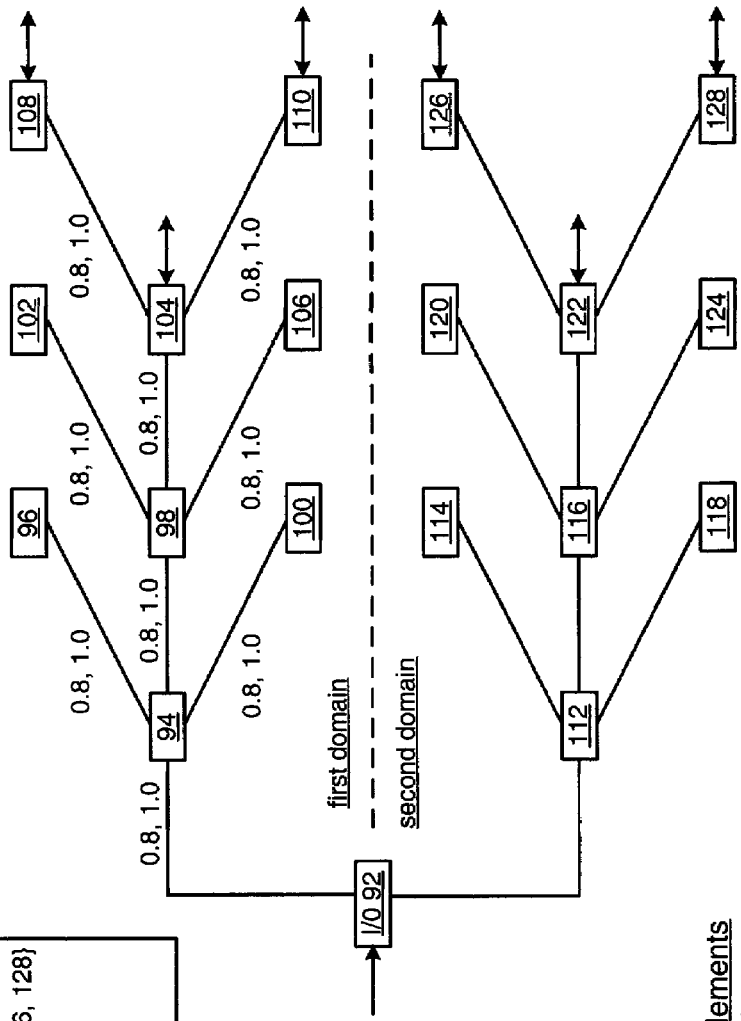
FIGS. 4A and 4B are functional block diagrams of a circuit having a plurality of circuit elements, each introducing an amount of delay that illustrates a method for statically calculating skew and for arranging circuit elements accordingly.

FIG. 4A is a functional block diagram of a circuit having a plurality of circuit elements in a clock distribution network, each introducing an amount of delay that illustrates a method for statically calculating skew and for arranging circuit elements accordingly. Ingoing data is received at an I/O data port 92 (or data pin) at a received clock. As may further be seen, the received data is produced from the I/O data port 92 to circuit elements within one of a first and a second domain.

FIG. 4B is similar to the upper portion of FIG. 4A. As may further be seen, however, the circuit of FIG. 4A is logically divided into a plurality of slices in FIG. 4B. These "slices" are used as part of determining NCA (nearest common ancestor) relationships. For example, within the first slice, only network element 94 is present. Element 94, however, is an NCA of a plurality of network elements (e.g., descendant nodes) as listed in the NCA table of FIG. 4B. While the NCA table of FIG. 4B lists all of the network elements for which network element 94 is an NCA in the described embodiment of the invention, alternate approaches may be realized. For example, the NCA table for network element 94 may be simplified to merely list the network elements to which network element 94 is directly coupled. Here, those elements are 96, 98 and 100. For this embodiment, at least one additional element would be required to see if those three elements were NCAs for other network elements. Because, in this example, NCA 94 includes 98 which is an NCA for other elements, the process would be repeated until all network elements were identified and no elements that are NCAs for other NCAs are determined. In effect, this alternate approach requires actively determining the elements actually listed for network element 94 within the table rather than merely listing them in a table.

Within the first domain, data is received from I/O data port 92 by circuit element 94. Circuit element 94 then produces data to circuit elements 96, 98, and 100. Circuit element 98 then produces data to circuit elements 102, 104, and 106. Circuit element 104 produces data to circuit elements 108 and 110. Within the second domain, a circuit element 112 receives data from I/O data port 92. Circuit element 112 then produces data to circuit elements 114, 116 and 118. Circuit element 116 then produces data to circuit elements 120, 122, and 124. Finally; circuit element 122 provides data to circuit elements 126 and 128.

Each circuit element within the first and second domains introduces an amount of delay that may vary from circuit element to circuit element. Because each circuit element within the first and second domains provides a varying amount of delay, the data may arrive at any given element at one of a minimum or maximum arrival time. Moreover, because each circuit element introduces delay, it is proper to consider each circuit element as providing a new clock (sibling clock). For example, a clock for data received from I/O data port 92 is different than a clock of data produced by circuit element 94. Similarly, the data produced by circuit element 98 is produced at a different clock than the data received by circuit element 98, which, in this case, is the clock of the data produced by circuit element 94.

Finding the nearest common ancestor is similar to finding a circuit element having a common clock signal for two circuit elements. For example, the first common clock signal for both circuit elements 102 and 108 is the clock of data received by circuit element 98. Stated differently, circuit element 98 is the nearest common ancestor for circuit elements 102 and 108 as shown in the nearest common ancestors table of FIG. 4.

The nearest common ancestor for any circuit element within the first domain and the second domain, however, is I/O data port 92. Accordingly, to determine clock skew between, for example, circuit element 100 (first domain) and circuit element 120 (second domain), then the clock skew resulting from I/O data port 92 would be subtracted from the calculated clock skews from circuit elements 100 and 120 according to one embodiment of the present invention.

Under prior art designs, skew for a given element would be calculated by summing arrival times for each circuit element in the data path between the circuit element and the originating data source. Thus, the calculation for skew for two circuit elements that are in the same domain would be similar in approach to the calculation for circuit elements 100 and 120 even though the two elements have a common ancestor that may be considered for removing pessimism. For example, a skew value for circuit element 108 would be determined by summing minimum and maximum arrival times for circuit elements 108, 104, 98, 94, and I/O data port 92. Similarly, clock skew for circuit element 102 is calculated by summing minimum and maximum arrival times for circuit elements 102, 98, 94, and I/O data port 92. In the prior art, these calculated clock skews for circuit elements 102 and 108 are merely as described. The present invention, however, includes calculating a nearest common ancestor circuit skew and subtracting the skew therefrom. That is, the contributions to skew up to the nearest common ancestor are eliminated, and the calculation only accounts for skew from the nearest common ancestor forward. In this manner, skew may be determined without unnecessary pessimism.

Circuit element 94, for example, is the nearest common ancestor for circuit elements 96, 100, 102, 106, 108, and 110. Similarly, circuit element 98 is the nearest common ancestor for circuit elements 102, 106, 108, and 110. Finally, circuit element 104 is the nearest common ancestor for circuit elements 108 and 110. These relationships are demonstrated in the nearest common ancestor table of FIG. 4A that corresponds to the functional block diagram of the circuit. Thus, according to the embodiment of the present invention, clock skew is determined for a given circuit element by finding the nearest common ancestor and deleting minimum and maximum arrival times that are common to both circuit elements. Stated differently, the minimum and maximum arrival times for the nearest common ancestors are deleted from the total calculated minimum and maximum arrival times for each of the two elements. Thus, the skew between circuit elements 102 and 108 is equal to the total skew calculated for each of the circuit elements less the skew for the nearest common ancestors, which is circuit element 98 in the described example.

FIG. 4B illustrates an efficient method for determining an NCA according to one embodiment of the present invention. The method described herein can find the nearest common ancestor dynamically without traversing the circuit, but rather with an efficient table lookup. First, a directed acyclic graph (DAG) is constructed representing the clock network. A depth-first search (DFS) of the clock graph (from graph sinks to sources) is used to topologically sort the nodes of the clock graph and assign each node a level label. Sources of the graph are labeled with level 1, and as the graph is topologically sorted, each node is labeled as the maximum level of any predecessor nodes plus 1. Each node is also initialized with an NCA set that contains only itself. In FIG. 4B, node 108, residing in maximum level of the clock graph (e.g., level 5), would be assigned the maximum level label, and its NCA set would contain only the node 108 {108}.

Next, each group of nodes having the same level number, from maximum level to 1 is processed according to one embodiment of the invention. For each group of nodes at a given level of the circuit, processing occurs for each node including adding the node's NCA set to the NCA set of its predecessor node(s). In FIG. 4B, nodes 108 and 110 are initially processed at the maximum level of the circuit. The contents of node 108's NCA set {108} are added to the NCA set for node 104, and the contents of node 110's NCA set {110} are also added to the NCA set for node 104. The resulting NCD set for node 104 is {104, 108, 110}. Nodes 102, 104, and 106 are added then processed for the preceding circuit level. Once each group of nodes for each level of the circuit is processed, each node's NCA set will contain the nodes that are reachable from the node.

For any given pair of nodes, the NCA set with the largest level number that contains both nodes is the nearest common ancestor for the pair of nodes. If no such NCA set contains both nodes, the nodes do not have a nearest common ancestor, and no common pessimism can be removed in the skew calculation between the pair of nodes. Furthermore, when searching for the NCA set that contains both nodes, one need only check the NCA sets of nodes that have two or more successor nodes. Consequently NCA sets with multiple successor nodes are placed in a table and are sorted in non-increasing order of the node's level. When given a pair of nodes from which to determine the nearest common ancestor, the NCA sets in this table are searched from maximum to minimum level, finding the NCA (if any) without having to traverse the entire clock network.

Generally, two types of skew are calculated. A setup slack based on a setup skew value is calculated to determine a minimum period or cycle time that is required for a signal to propagate to a destination register from a source register. A hold check slack based upon a hold check value is calculated to ensure that a transmitted signal does not arrive early from the perspective of the destination register. For clarification, consider the following example. To calculate a setup skew for a combinational path from circuit element 108 (source) to circuit element 102 (destination), a setup skew calculation according to one embodiment of the present invention includes the following type of analysis:

As may be seen in FIG. 4A, arbitrary values of minimum and maximum arrival times of 0.8 nanoseconds (nS) and 1.0 nS are assigned from element to element for exemplary purposes. A minimum arrival time at the destination (102) is equal to (i.e., the path from 92 to 94 to 98 to 102):

0.8+0.8+0.8=2.4 nS.

A minimum arrival time at a nearest common ancestor (circuit element 98) is equal to:

0.8+0.8=1.6 nS.

A maximum arrival time at the source is equal to:

+1.0+1.0+1.0=4.0 nS.

A maximum arrival time at the nearest common ancestor is equal to:

+1.0=2.0 nS.

Thus, according to the formula for calculating setup skew:

setup skew=((min (arrival at des)−min (arrival at NCA))−((max (arrival at source)−max (arrival at NCA))

Setup skew is therefore equal to:

(2.4−1.6)−(4.0−2.0)=−1.2 nS.

Under prior art methods, setup skew would be calculated to be equal to the min (arrival at des)−max (arrival at source) which would be equal to 2.4−4.0=−1.6 nS.

By removing the pessimism, therefore, the setup skew was reduced in magnitude from 1.6 nS to 1.2 nS, a difference of 0.4 nS. This reduction amounts to a 25% reduction in magnitude for the setup skew value.

Similarly, for calculating skew for hold check, the formula is:

Hold check value=((max (arrival at des)−max (arrival at NCA))−((min (arrival at source)−min (arrival at NCA))

Thus, hold check value=3.0−2.0−(3.2−1.6)=−0.6 nS.

Under traditional methods, however, the hold check slack would be determined to be equal to 3.0−3.2=−0.2 nS. Moreover, because the hold time is a negative number for the specified source and destination, cycle time (period) requirements are increased by 0.2 nS.

Each of the circuit elements within FIG. 4A may be any element that may introduce some skew, such as a resistor, a transistor, a buffer, an ASIC, a processor, or even a circuit trace. Thus, any one of these circuit elements may be a nearest common ancestor for the purpose of calculating clock skew.

To calculate a hold check slack from circuit element 102 to 108, using the same methods described above results in a hold check slack value of 0.4 (in contrast to a value of 1.0 which is a determined hold skew value using traditional methods for calculation hold skew). The value of 0.4, therefore, reduces pessimism in the hold check slack.

Finally, FIG. 4A makes it easy to visually determine that circuit element 98 is the nearest common ancestor for circuit elements 102 and 108. To properly determine the NCA by algorithm requires finding a set of circuit elements that include both the source and destination circuit elements that is closest to the source and destination circuit elements. Generally, this includes determining the circuit element having the smallest group of circuit elements that include the source and destination circuit elements.

Figure 5:
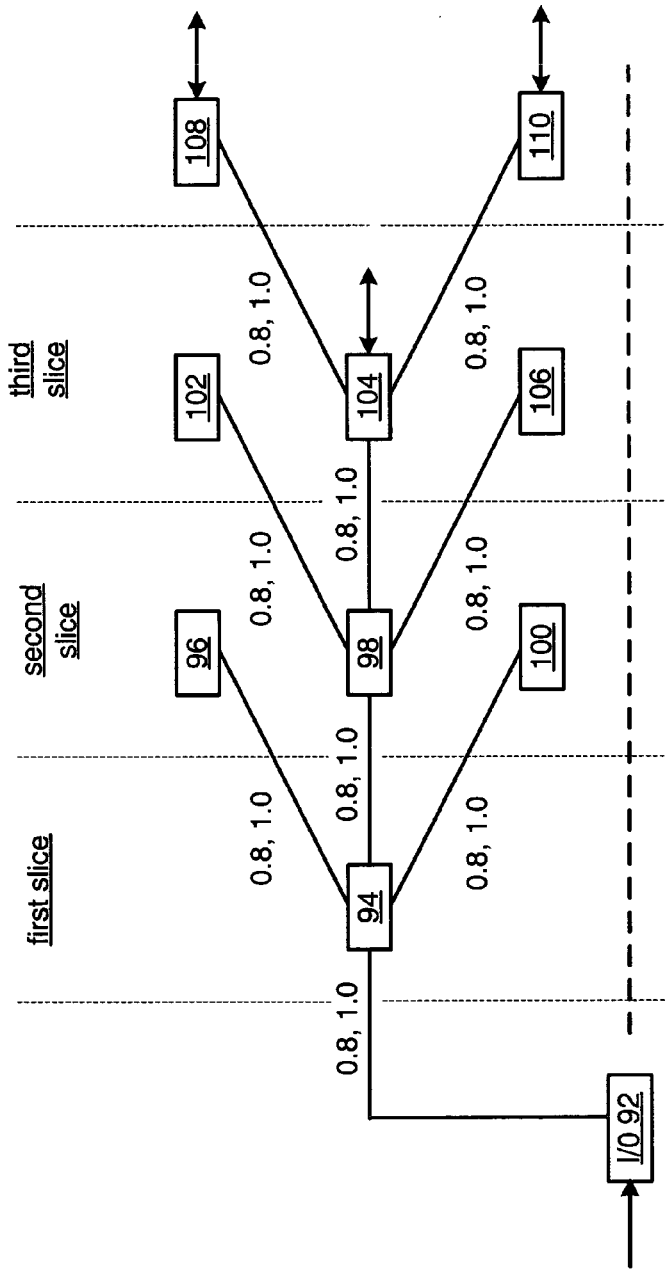
FIG. 5 is a functional block diagram of programmable logic with delay elements that illustrates skew calculation in corresponding circuit layout according to one embodiment of the present invention.

FIG. 5 is a functional block diagram of programmable logic with delay elements that illustrates skew calculation in a corresponding circuit layout according to one embodiment of the present invention. The programmable logic of FIG. 5 includes six domains, namely, first domain 150, second domain 152, third domain 154, fourth domain of 156, fifth domain 158, and sixth domain 160 in a clock distribution network. Each of the six domains 150-160 that are shown includes a plurality of circuit elements 162 (shown as 162*a* and 162*b* for exemplary purposes). In the specific examples shown, each domain 150-160 includes 24 circuit elements 162. Each circuit element 162 is coupled to a local clock bus that in turn is coupled to a primary clock bus. For example, the circuit element illustrated as circuit element 162*a* is coupled to local clock bus 164 which in turn is coupled to primary clock bus 166. As may also be seen, circuit elements may be coupled to any one of a plurality of local clock buses, including local clock bus 168, 170, 172, 174 and 176. The particular configuration of elements and local and primary clock buses is exemplary only. The described invention applies with equal force to other configurations.

As was stated before, programmable interconnect points (PIPs) may also operate as a nearest common ancestor for a plurality of downstream circuit elements. The reason, of course, is that PIPs, especially as configured in programmable logic with buffers and/or other circuitry, introduce a delay thereby resulting in generation of a sibling clock (clock of outgoing data) relative to a received clock (clock of the received or ingoing data). Output pins of logic blocks may also operate as a nearest common ancestor for a plurality of downstream circuit elements, since logic blocks also introduce a delay. Because today's integrated circuits and other large-scale devices may include thousands of circuit elements, and perhaps billions of paths between register pairs, determining exact clock skew can be an overwhelming or very expensive task.

FIG. 5 provides an example of a layout of a typical programmable logic that includes many rows and columns of circuit elements. Accordingly, the inventive method for calculating clock skew may produce skew values that are significantly lower than calculated skew values using traditional methods for determining skew. As such, operation of a circuit, such as the programmable logic of FIG. 5, may be had at a higher frequency, and thus a shorter signal length or cycle time is required. Moreover, circuit elements 162 may be arranged differently based on there being more accurate skew calculations available. For example, two circuit elements may be placed in different domains 150-160 based on the more accurate and reduced skew values. One aspect of the present invention relates to the clock source for a given circuit path in circuits having a plurality of clock sources as shown here in FIG. 5. The present embodiments of the invention specifically include not only separating circuit components according to NCAs, but also be source clock. Accordingly, setup slack and hold checking may be determined in relation to a source clock as well as NCAs.

Figure 6:
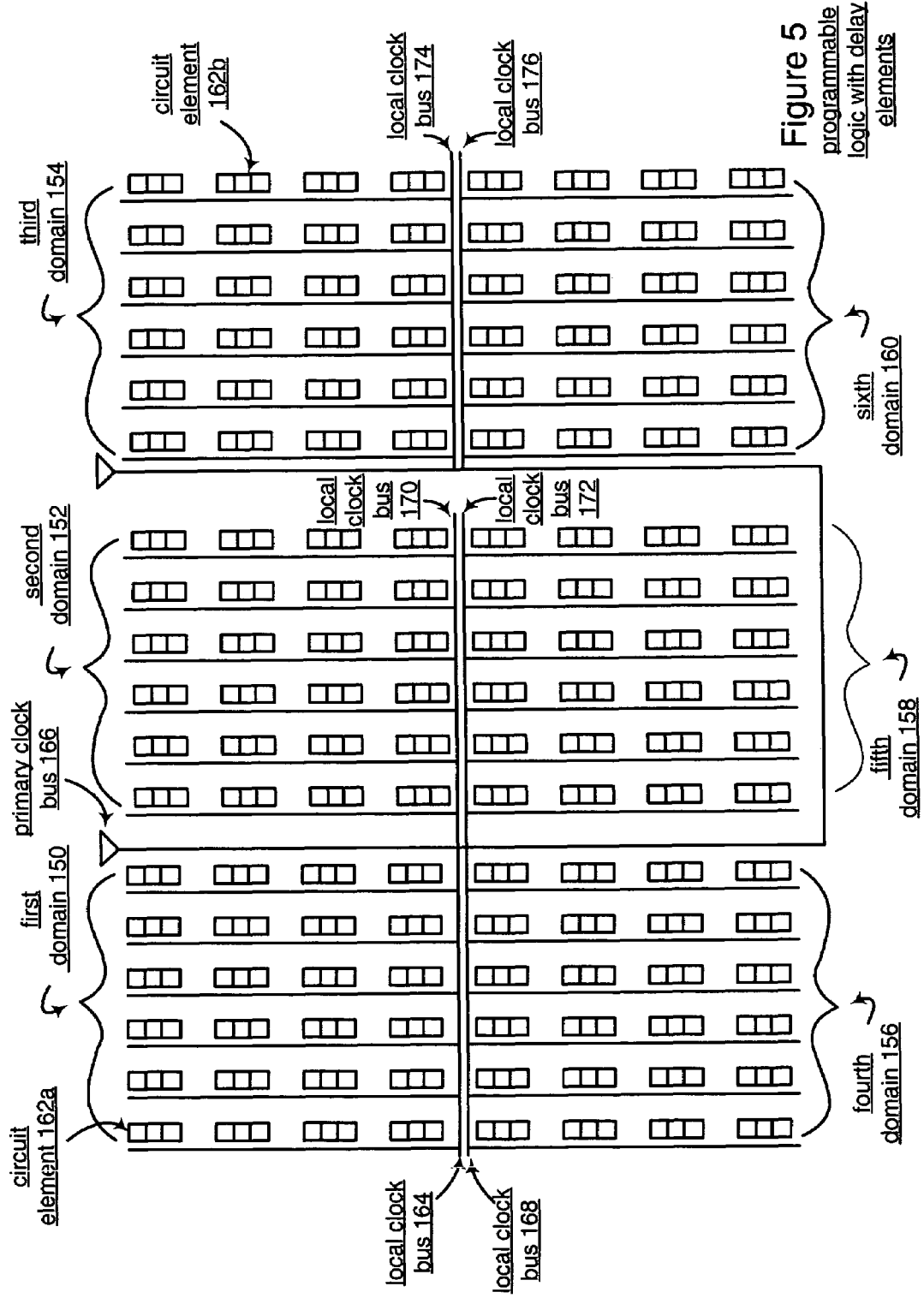
FIG. 6 is a flowchart that illustrates a method for calculating a setup skew according to one embodiment of the present invention.

FIG. 6 is a flowchart that illustrates a method for calculating a setup skew according to one embodiment of the present invention. Initially, the invention includes determining a nearest common ancestor in a clock distribution network (step 180). As described above, this step generally involves finding a nearest common ancestor for a source and a destination node (or register of a circuit element and thus is also referred to herein as a circuit element). If a table is developed as described above listing circuit elements that serve as a nearest common ancestor for two or more registers or circuit elements, then this step includes selecting the circuit element or register that serves as a nearest common ancestor. More specifically, this step includes selecting a common ancestor that includes both the source and destination circuit elements and that has the smallest number of circuit elements listed as elements of the set of all the sets that include the source and destination circuit elements. In other words, finding a common ancestor that generally includes having the smallest set of elements that includes both the source and destination circuit elements is the equivalent of finding the nearest common ancestor to the pair of clock loads. The NCA set table, sorted by level, represents the NCAs of the clock network, and can be quickly searched to find the NCA for a given pair of pins without traversing the entire clock network.

Thereafter, the method of one embodiment of the invention includes determining a minimum and maximum NCA clock skews for the nearest common ancestor determined in the previous step (step 182). Because a setup skew is being determined in the method of FIG. 6, the invention includes determining a minimum clock skew for a destination circuit element and subtracting the minimum nearest common ancestor clock skew therefrom to determine a destination node minimum delta clock skew (step 184). Thereafter, the invention includes determining a maximum clock skew for a source node or circuit element and subtracting the maximum nearest common ancestor clock skew to determine a source node maximum delta clock skew (step 186). Thereafter, the invention includes subtracting the source node maximum delta clock skew from the destination node minimum delta clock skew to determine a setup skew between the source and destination nodes (step 188). This determined setup skew may then be used to determine a frequency for the given circuit or, alternatively, for determining acceptable layout options for the source node and the destination node.

Figure 7:
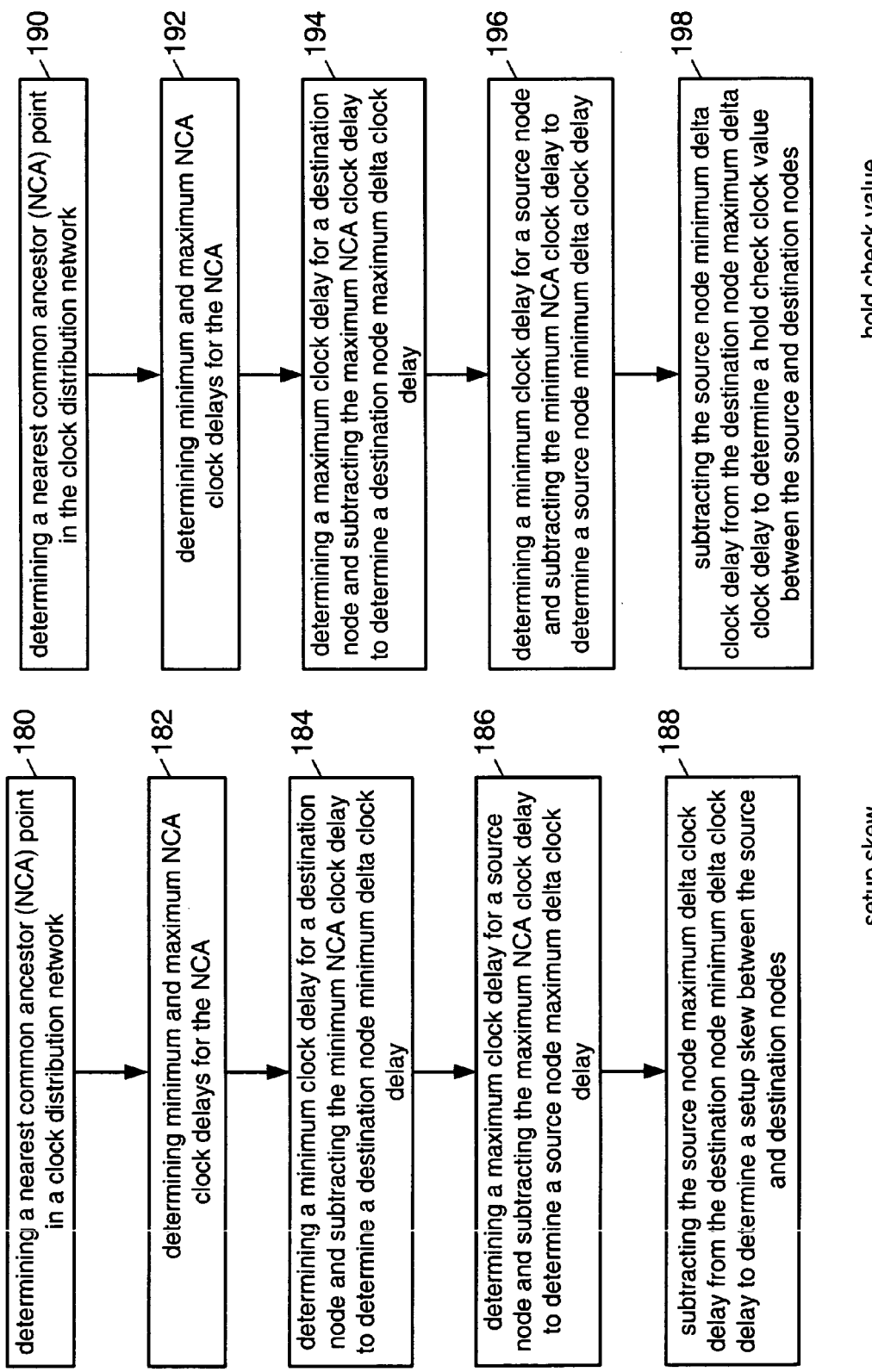
FIG. 7 is a flowchart illustrating a method for determining a hold check value according to one embodiment of the present invention.

FIG. 7 is a flowchart illustrating a method for determining a hold check value according to one embodiment of the present invention. As in the method of FIG. 6, the first two steps include determining a nearest common ancestor in the clock distribution network (step 190) and determining minimum and maximum nearest common ancestor clock skews for the nearest common ancestor (step 192). Thereafter, the invention includes determining the maximum clock skew for a destination node and subtracting the maximum nearest common ancestor clock skew to determine a destination node maximum delta clock skew (step 194). Additionally, the invention includes determining a minimum clock skew for a source node and subtracting the minimum nearest common ancestor clock skew to determine a source node minimum delta clock skew (step 196). Finally, the invention includes subtracting the source node minimum delta clock skew from the destination node maximum delta clock skew to determine a hold check value between the source and destination nodes (step 198).

Figure 8:
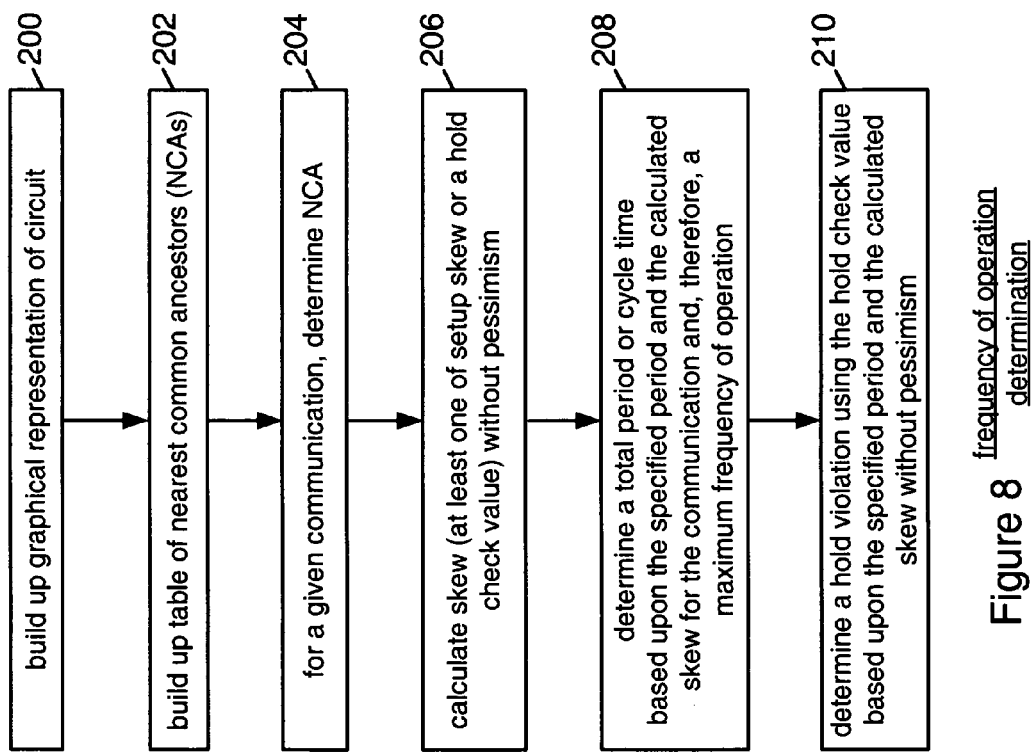
FIG. 8 is a flow chart illustrating a method for determining a maximum frequency of operation for a circuit based on calculating skew according to one embodiment of the present invention.

FIG. 8 is a flowchart illustrating a method for determining a maximum frequency of operation for a circuit based on calculating skew according to one embodiment of the present invention. Initially, the inventive method includes building up graphical representation of a circuit, such as a DAG (step 200). Additionally, the method includes building up a table of nearest common ancestors (NCAs) in the described embodiment of the invention to facilitate determining an NCA (step 202). Thus, the next step includes, for a given communication, determining the NCA between the source and destination circuit elements or registers (step 204). After determining the NCA, the invention includes calculating skew without pessimism (step 206). In the described embodiment, the skew calculated in this step is one of a setup skew (to ensure adequate time for a signal to arrive at a destination), a hold slack (to prevent "racing" or a signal arriving too early) or calculating both setup skew and hold slack. More generally, the calculated setup skew can be used in a setup check to determine the maximum frequency of operation, while the calculated hold skew can be used in a hold check to ensure that a race condition doe not occur between register pairs. As stated previously, pessimism is defined herein as including unnecessary skew values in a skew determination as described herein. Thereafter the invention includes determining a total period or cycle time based upon the specified period and the calculated skew for the communication and, therefore, a maximum frequency of operation (step 208). The calculated skew may either be a setup skew or a hold check. Finally, the invention includes an optional step for determining a hold violation using the hold check value based upon the specified period and the calculated skew without pessimism (step 210), reducing false hold errors due to overly-pessimistic skew calculations.

Figure 9:
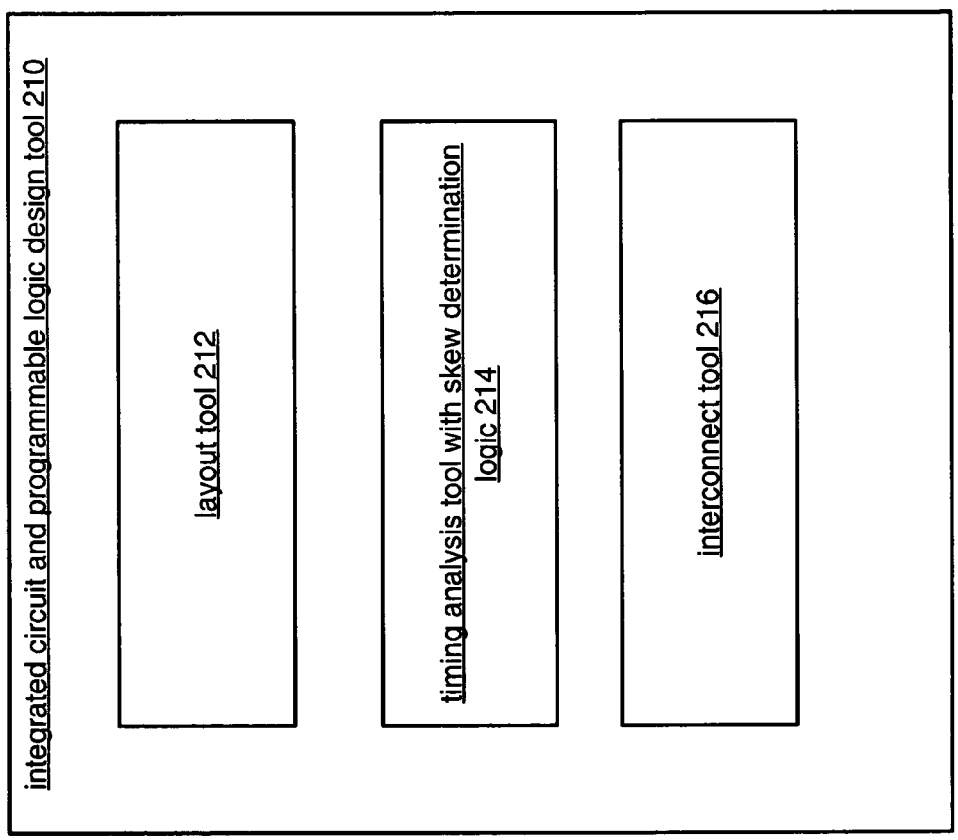
FIG. 9 is a functional block diagram of an integrated circuit and programmable logic design tool formed according to one embodiment of the present invention.

FIG. 9 is a functional block diagram of an integrated circuit and programmable logic design tool formed according to one embodiment of the present invention. An integrated circuit and programmable logic design tool 210 includes a layout tool 212, a timing analysis tool 214 for performing skew calculations according to the present invention disclosed herein, and an interconnect tool 216 that performs interconnect design based upon the layout produced by the layout tool 212 and the skew calculations performed by timing analysis tool 214. The timing analysis tool 214 also is operable to re-calculate skew based not only on the layout produced by layout tool 212, but also by the interconnect tool 216 after the interconnects are determined to verify that the final design meets operational requirements at a specified frequency of operation.

The integrated circuit and programmable logic design tool 210 more generally illustrates a tool that operates according to the described invention to provide a design for, or to test a design of, a large-scale device such as an integrated circuit, ASIC or programmable logic or combination thereof. The circuit layout, interconnects or operation (including frequency of operation) are based upon operation of the integrated circuit and programmable logic design tool 210 according to the described embodiment of the invention.

Figure 10:
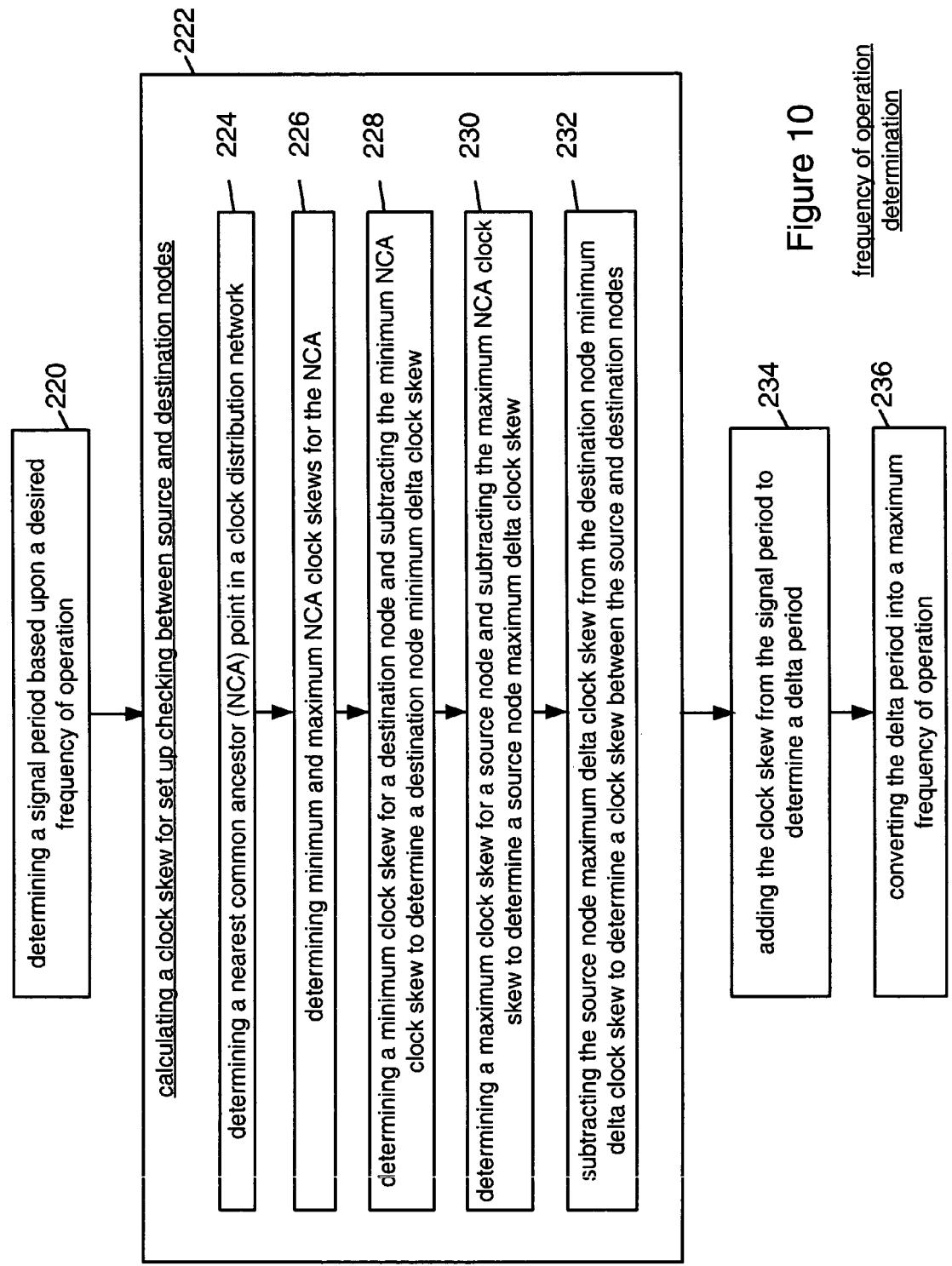
FIG. 10 is a flowchart that illustrates a method for determining a maximum frequency of operation according to one embodiment of the present invention.

FIG. 10 is a flowchart that illustrates a method for determining a maximum frequency of operation according to one embodiment of the present invention. Initially, a design tool determines a signal period based upon a desired frequency of operation for signal transmissions between source and destination nodes (step 220). Thereafter, the invention includes calculating a clock skew for setup checking between the source and destination nodes (step 222). The step of calculating a clock skew for setup checking between the source and destination nodes includes a plurality of steps.

Initially, the nearest common ancestor in a clock distribution network must be determined (step 224). Thereafter, minimum and maximum nearest common ancestor clock skews for the nearest common ancestor must be determined (step 226). Thereafter, the invention includes determining a minimum clock skew for a destination node and subtracting the minimum nearest common ancestor clock skew to determine a destination node minimum delta clock skew (step 228). Thereafter, the invention includes determining a maximum clock skew for a source node and subtracting the maximum nearest common ancestor clock skew to determine a source node maximum delta clock skew (step 230). Finally, calculating the setup skew between the source and destination nodes includes subtracting the source node maximum delta clock skew from the destination node minimum delta clock skew to determine a clock skew between the source and destination nodes (step 232).

After the steps for calculating a setup skew between the source and destination nodes are performed, the embodiment of the invention includes adding the clock skew to the desired signal length to determine a delta period (step 234). The delta period is then used to calculate a corresponding maximum frequency of operation as is known by one of average skill in the art (step 236).

The above steps illustrate that an initially specified frequency of operation and corresponding period (signal length) are modified based upon a calculated skew. As skew increases in magnitude, the total period required increases and the frequency of operation decreases (inverse of the total period). The skew calculation may also be used, however, in other manners. For example, if a specified minimum frequency is required, then the corresponding signal period equals the maximum signal period plus skew. Thus, the skew would be subtracted from the signal period value to determine a new (and higher) frequency of operation. Thus, skew calculations according to the described embodiments may be used in many different manners as a part of designing and testing a device such as an integrated circuit or other large-scale device such as an FPGA or other programmable logic.

FIG. 11 is a flowchart illustrating a method for calculating setup slack without pessimism for a delay between a source node and a destination node according to one embodiment of the present invention. The method initially comprises determining a nearest common ancestor point (NCA) between source and destination nodes in a clock distribution network (step 250) and determining a setup skew without pessimism (step 252). Determining a setup skew in step 252 further includes determining minimum and maximum NCA clock skews (step 254). The method includes, thereafter, determining a minimum clock skew for the destination node and subtracting the minimum NCA clock skew to determine a destination node minimum delta clock skew (step 256). Additionally, the method includes determining a maximum clock skew for the source node and subtracting the maximum NCA clock skew to determine a source node maximum delta clock skew (step 258). To finish calculating a setup skew, the invention includes subtracting the source node maximum delta clock skew from the destination node minimum delta clock skew to determine a setup slack between the source and destination nodes (step 260).

After the above steps for determining a setup slack, the method includes adding the setup slack value to a calculated delay to determine an actual delay (step 262). Finally, the method includes determining a required delay value and subtracting the actual delay therefrom to determine the setup slack without pessimism (step 264).

The method of FIG. 11 is for a circuit or device in which an NCA may comprise, for example, an output pin of a logic block or a programmable interconnect point within programmable fabric. Generally, the NCA is any circuit element in which a delay is introduced thereby resulting in an outgoing clock being different than an ingoing clock for ingoing data.

FIG. 12 is a method for calculating hold check slack without pessimism for a transmission between a source node and a destination node according to one embodiment of the invention. The described embodiment of the inventive method initially includes determining a nearest common ancestor point (NCA) of the source and delay nodes in the clock distribution network (step 270) and determining a hold check value (step 272). As may be seen, determining a hold check value includes a plurality of steps. The first of these plurality of steps within step 272 includes determining minimum and maximum NCA clock skews (step 274). Determining the hold check value of step 272 further includes determining a maximum clock skew for the destination node and subtracting the maximum NCA clock skew to determine a destination node maximum delta clock skew (step 276). Also, the method according to one embodiment of the invention includes determining a minimum clock skew for the source node and subtracting the minimum NCA clock skew to determine a source node minimum delta clock skew (step 278). Thereafter, the invention includes subtracting the source node minimum delta clock skew from the destination node maximum delta clock skew to determine a hold check between the source and destination nodes (step 280).

Once the hold check is determined in step 280, the invention includes a series of steps for determining the total hold check slack without pessimism. The series of steps includes calculating a delay from the source to the destination node (step 282) and subtracting the hold check value from the calculated delay to determine an actual delay (step 284). Finally, the method includes determining a required delay value and subtracting the actual delay to determine the hold check slack without pessimism (step 286).

FIG. 13 is a flowchart that illustrates a method for calculating an actual delay for setup slack in programmable fabric according to one embodiment of the invention. Initially, one embodiment of the invention comprises defining a plurality of paths between a source and a destination (step 290). For each of the plurality of paths, the method further includes determining a first subset of paths having a first nearest common ancestor (NCA) and a first common destination clock (step 292). Similarly, the method includes determining a second subset of paths having a second NCA and a second common destination clock (step 294). For each of the first and second subsets of paths, the method includes calculating a setup skew value (step 296). The methods described herein are divided according to common destination clocks as the differing destination clocks may be operating on different phases.

Calculating the setup skew value for the first and second subsets of paths further includes determining minimum and maximum NCA clock skews (step 298) and determining a minimum clock skew for the destination node and subtracting the minimum NCA clock skew to determine a destination node minimum delta clock skew (step 300). As with the methods described before for calculating setup skew, the invention further includes determining a maximum clock skew for the source node and subtracting the maximum NCA clock skew to determine a source node maximum delta clock skew (step 302) and subtracting the source node maximum delta clock skew from the destination node minimum delta clock skew to determine a setup skew between the source and destination nodes (step 304). Generally, the setup and hold skew are calculated only once for a given pair of registers even though a plurality of paths may exist between the pair of registers.

The method according to the embodiment of the invention further includes calculating a delay from the source to the destination node (step 306). Thereafter, the method includes adding the setup skew to the calculated delay to determine an actual delay (step 308). Finally, the invention includes determining a required delay value and subtracting the actual delay to determine the setup slack without pessimism (step 310).

FIG. 14 is a flowchart illustrating a method for calculating a hold check slack for a plurality of nodes defining a plurality of paths within a programmable fabric according to one embodiment of the invention. Initially, the method includes determining a first subset of paths having a first nearest common ancestor (NCA) (step 320) and calculating a delay for each path within the first subset of paths (step 322). Further, the invention includes determining a second subset of paths having a second NCA (step 324) and calculating a delay for each path within the second subset of paths (step 326). For each calculated delay of the first and second subset of paths, the invention further includes calculating hold check slack without pessimism (step 328). Calculating hold check slack without pessimism further includes calculating setup slack as described herein.

FIG. 15 is a flowchart illustrating a method for calculating a transmission period in programmable fabric according to one embodiment of the present invention. The method includes determining a first subset of paths having a first common destination clock (step 340) and further determining a second subset of paths having a second common destination clock wherein the first and second subset of paths further each include a nearest common ancestor clock source (step 342). Additionally, for each of the first and second subsets of paths, the invention includes calculating a setup slack without pessimism between at least two circuit elements in each of the first and second subsets of paths (step 344) and calculating a hold check slack without pessimism between at least two circuit elements in each of the first and second subsets of paths (step 346). Finally, based upon the calculated setup slack and the hold check slack, the invention includes determining an actual period for transmission between the at least two circuit elements in each of the first and second subsets of paths (step 348).

FIG. 16 is a functional schematic block diagram illustrating one aspect of the present invention. As may be seen, the circuit of FIG. 16 is similar to the circuit of FIGS. 4A and 4B but further includes a plurality of circuit elements 350, 352 and 354 coupled to provide a second path between circuit elements 94 and 96 (in addition to the first path which is a direct coupling). Generally, one purpose of FIG. 16 is to illustrate that there are often a plurality of circuit paths between two circuit elements. Accordingly, if one were to calculate a hold check or setup slack between the two elements for each of the circuit paths, a calculated value of the slowest path is overly pessimistic for transmissions over a shorter or faster path. Here, the path along circuit elements 350, 352 and 354 yields a larger slack/check value than the direct transmission between circuit elements 94 and 96.

As a further example, consider the example of both circuit elements 110 and 102 transmitting data to circuit element 108. Circuit element 110 has circuit elements 98 and 104 as NCAs while circuit element 102 has circuit element 98 for an NCA. To merely use the one common NCA 98 for transmissions from 102 as well as 110 result in overly pessimistic calculations for data transmissions from circuit element 110. Note that if we use element 98 as the NCA, we will be pessimistic for the path between elements 110 and 108. Conversely, if we use element 104 as the NCA, we will be optimistic for the path between elements 102 and 108. Consequently there is no single arrival time for element 108 that removes the optimal amount of pessimism for paths from element 102 or to element 110. According to one aspect of the present embodiments of the invention, therefore, the circuit is divided based upon NCAs to avoid calculation of overly pessimistic values. For example, one can divide the circuit into two partitions, one for the paths from element 102 to element 108, and another for paths from element 108 to element 110. By dividing the circuit into partitions based on NCA, the maximum amount of pessimism may be removed from each partition. This is achieved by first dividing the data circuit into partitions based on the destination clock, and then again dividing each partition based on NCA (relative to the destination clock).

Thus, the invention further includes calculating setup slack and hold check values for each division of the circuit by NCA. Accordingly, for any two circuit elements, the calculated values for setup slack and hold check are based on actual values for a most efficient path between the two circuit elements.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the sprit and scope of the present invention as defined by the claims.

What is claimed is:

1. A method for calculating setup slack without pessimism for a delay between a source node and a destination node, comprising:
    determining a nearest common ancestor (NCA) of the source and destination nodes in a clock distribution network;
    calculating a setup skew value, wherein calculating the setup skew value comprises
        determining minimum and maximum NCA clock skews;
        determining a minimum clock skew for the destination node and subtracting the minimum NCA clock skew to determine a destination node minimum delta clock skew;
        determining a maximum clock skew for the source node and subtracting the maximum NCA clock skew to determine a source node maximum delta clock skew; and
        subtracting the source node maximum delta clock skew from the destination node minimum delta clock skew to determine the setup skew value between the source and destination nodes; and
    calculating setup slack based upon the setup skew value.

2. The method of claim 1 wherein calculating the setup slack based upon the setup skew value comprises:
    calculating a delay from the source to the destination node;
    adding the setup skew to the calculated delay to determine an actual delay; and
    determining a required delay value and subtracting the actual delay to determine the setup slack.

3. A method for calculating hold check slack without pessimism for a delay between a source node and a destination node, comprising:
    determining a nearest common ancestor (NCA) of the source and delay nodes in a clock distribution network;
    calculating a hold check value, wherein calculating the hold check comprises determining minimum and maximum NCA clock skews;

determining a maximum clock skew for the destination node and subtracting the maximum NCA clock skew to determine a destination node maximum delta clock skew;

determining a minimum clock skew for the source node and subtracting the minimum NCA clock skew to determine a source node minimum delta clock skew; and subtracting the source node minimum delta clock skew from the destination node maximum delta clock skew to determine a hold check slack between the source and destination nodes; and calculating hold check slack based upon the hold check value.

4. The method of claim 3 wherein calculating the hold check slack based upon the hold check value further comprises:

calculating a delay from the source to the destination node;

subtracting the hold check value from the calculated delay to determine an actual delay; and determining a required delay value and subtracting the required delay from the actual delay to determine the hold check slack.

5. A method for calculating setup slack for a plurality of paths, comprising:

defining a plurality of paths between a source node and a destination node, and for each path of the plurality of paths:

determining a first subset of paths having a first nearest common ancestor (NCA) and a first common destination clock;

determining a second subset of paths having a second NCA and a second common destination clock, wherein the first and second subsets of paths and the corresponding first and second common destination clocks are grouped separately based on the first and second common destination clocks to eliminate potential phase differences in the clocks; and for each of the first and second subsets of paths, calculating a setup slack, wherein calculating the setup slack comprises determining a first and second nearest common ancestor (NCA) of the source and destination nodes for each of the first and second subsets of paths;

determining minimum and maximum NCA clock skews for each of the determined first and second NCA;

determining a minimum clock skew for the destination node and subtracting the minimum NCA clock skew to determine a destination node minimum delta clock skew;

determining a maximum clock skew for the source node and subtracting the maximum NCA clock skew to determine a source node maximum delta clock skew;

subtracting the source node maximum delta clock skew from the destination node minimum delta clock skew to determine a setup skew between the source and destination nodes;

calculating a delay from the source to the destination node;

adding the setup skew to the calculated delay to determine an actual delay; and determining a required delay value and subtracting the actual delay to determine the setup slack.

6. A method for calculating a hold check slack without pessimism for a plurality of nodes defining a plurality of paths, comprising:

determining a first subset of paths having a first nearest common ancestor (NCA);

calculating a delay for each path within the first subset of paths;

determining a second subset of paths having a second NCA;

calculating a delay for each path within the second subset of paths; and for each calculated delay of the first and second subset of paths, calculating hold check slack, wherein calculating hold check slack for each path within each subset of paths comprises determining a nearest common ancestor (NCA) of the source and destination nodes and separating analyses for each destination node based upon destination clocks determining minimum and maximum NCA clock skews;

determining a maximum clock skew for the destination node and subtracting the maximum NCA clock skew to determine a destination node maximum delta clock skew;

determining a minimum clock skew for the source node and subtracting the minimum NCA clock skew to determine a source node minimum delta clock skew;

subtracting the source node minimum delta clock skew from the destination node maximum delta clock skew to determine a hold check for hold check slack checking between the source and destination nodes;

calculating a delay from the source to the destination node;

subtracting the hold check from the calculated delay to determine an actual delay; and determining a required delay value and subtracting the required delay from the actual delay to determine the hold check slack.

7. A method for calculating setup slack without pessimism for a delay between a source node and a destination node, comprising:

determining a nearest common ancestor (NCA) of the source and destination nodes in a clock distribution network;

calculating a setup skew value;

calculating setup slack based upon the setup skew value, wherein calculating the setup slack based upon the setup skew value comprises calculating a delay from the source to the destination node;

adding the setup skew to the calculated delay to determine an actual delay; and determining a required delay value and subtracting the minimum NCA clock skew to determine the setup slack.

* * * * *